Aug. 5, 1969 W. BLEICKARDT 3,459,973

HIGH-SPEED BINARY COUNTER

Filed April 28, 1967

INVENTOR
W. BLEICKARDT
BY Leonard M. Arnold
ATTORNEY

United States Patent Office 3,459,973
Patented Aug. 5, 1969

3,459,973

HIGH-SPEED BINARY COUNTER

Werner Bleickardt, Red Bank, N.J., assignor to Bell Telephone Laboratories, Incorporated, Murray Hill and Berkeley Heights, N.J., a corporation of New York Filed Apr. 28, 1967, Ser. No. 634,536
Int. Cl. H03k 3/335
U.S. Cl. 307—286 1 Claim

ABSTRACT OF THE DISCLOSURE

A high-speed binary counter using a tunnel diode in the collector circuit of one transistor of an emitter coupled transistor pair which sets and resets the tunnel diode in accordance with the signals received from a second emitter coupled transistor pair, of complementary conductivity type with respect to said first transistor pair, acting as a gate and connected between the input signals and the base electrodes of the first transistor pair.

BACKGROUND OF THE INVENTION

This invention relates to high-speed binary counter circuits and more particularly to such counters using solid state devices and including a tunnel diode as a memory device.

There are many different solid state binary counter circuits in use today. Some, such as the Eccles-Jordan counter, use transistors exclusively and while having relatively wide voltage and device margins, in that the circuits will operate over a relatively wide range of input signals, bias voltages, and operating parameters of the active devices, these circuits are limited to relatively low speeds of operation. Other such circuits make use of tunnel diodes exclusively as the active devices, and although these circuits possess very high speeds of operation they have relatively limited device and voltage margins and their general utility is therefore limited.

It is an object of this invention to increase the operating voltage and device margins in binary counter circuits while maintaining the ability of such circuits to operate at relatively high speeds.

SUMMARY OF THE INVENTION

In accordance with this invention, a binary counter having wide device and operating voltage margins employs a tunnel diode in the collector circuit of one transistor of an emitter coupled transistor pair which serves to set and reset the tunnel diode in accordance with the signals received from a second emitter coupled transistor pair, whose transistors are of complementary conductivity type, with respect to those of the first transistor pair, acting as a gate and connected between the input signals and the base electrodes of the first transistor pair.

BRIEF DESCRIPTION OF THE FIGURES

This invention will be more fully comprehended from the following detailed description taken in conjunction with the drawings in which.

DETAILED DESCRIPTION OF THE ILLUSTRATIVE EMBODIMENTS

Figure 1:
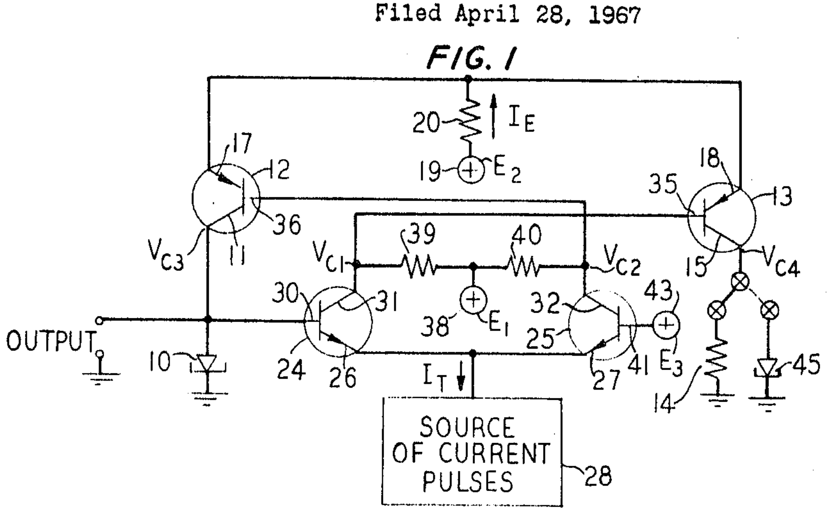
FIG. 1 is a schematic diagram of a binary counter circuit embodying this invention.

In the binary counter circuit, in accordance with the invention and as shown in FIG. 1, three circuit functions combine to produce a highly stable yet relatively high-speed binary counter. The first function is that of memory and is performed by a tunnel diode 10 connected between the collector electrode 11 of a transistor 12 and ground; transistor 12 being one of two p-n-p type emitter coupled transistors 12, 13, performing the second function of setting and resetting the tunnel diode 10. A resistor 14 is connected between the collector electrode 15 of transistor 13 and ground, and the output signal may be taken across resistor 14. As the term emitter coupled implies, the emitter electrodes 17 and 18 of transistors 12 and 13, respectively, are connected together and to a source 19 of positive voltage, designated $E_2$, by means of a resistor 20.

The third function is performed by a second emitter coupled transistor pair comprising n-p-n transistors 24 and 25 having their emitter electrodes, 26 and 27, respectively, connected to a source 28 of input current pulses to be counted. This second emitter coupled transistor pair functions as a gate to route input pulses to one or the other of transistors 12 and 13 depending on the state of the tunnel diode. This end is accomplished under the control of the state of the tunnel diode by connecting the base electrode 30 of transistor 24 to the anode of the tunnel diode 10 connected to collector electrode 11 of transistor 12, and the connection of collector electrodes 31 and 32, of transistors 24 and 25, respectively, to the base electrodes 35 and 36 of transistors 13 and 12 respectively. With collector electrodes 31 and 32 connected to source 38 of positive voltage of value $E_1$, which is much smaller than $E_2$ the voltage of source 19, by means of resistors 39 and 40, respectively, and base electrode 41 of transistor 25 connected to source 43 of positive voltage $E_3$, the emitter coupled transistors 24 and 25 form a gate to route input pulses to transistors 12 and 13, in the manner to be described below.

Figure 2:
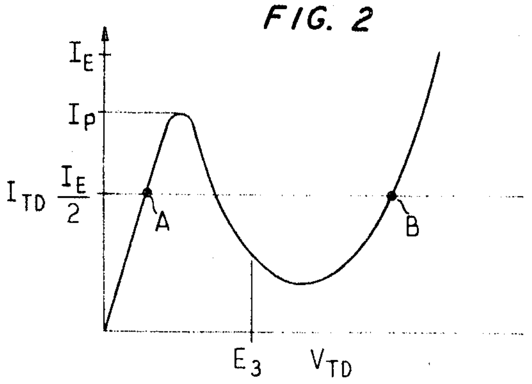
FIG. 2 is the current versus voltage characteristic of the tunnel diode shown in the collector circuit of the transistor shown in the leftmost portion of FIG. 1.
Figure 3:
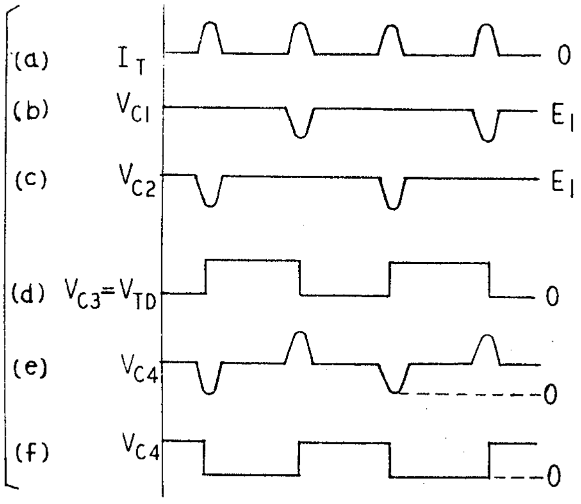
FIG. 3 is a series of waveforms illustrating various voltages and waveforms present at different points in the circuit shown in FIG. 1.

Between current input pulses, the input current from source 28 is zero as shown in line *a* of FIG. 3. Both collectors 31 and 32 of transistors 24 and 25 are at potential $E_1$ when the input current is zero as is shown in lines *b* and *c* of FIG. 3 where $V_{C1}$ designates the voltage at the collector electrode 31, and $V_{C2}$ designates the voltage at the collector electrode 32. Since collector electrodes 31 and 32 are connected to base electrodes 35 and 36 of transistors 13 and 12 respectively, these base electrodes 35 and 36 are at the same potential and the current flowing from source 19, which current is designated $I_E$, is divided about equally between the emitter electrodes 17 and 18 of transistors 12 and 13 between input current pulses. Since the base current in a transistor is very close to zero, the current flowing through the tunnel diode at this time is $I_{E/2}$ and is chosen to be slightly above half the peak current $I_p$ of the tunnel diode. The current-voltage characteristic of the tunnel diode, where voltage across the diode is plotted as the abscissa and current through the diode as the ordinate, is shown in FIG. 2 and, as illustrated for a current value $I_{E/2}$, the diode can be either in its low voltage state, shown as point A, or in its high voltage state, shown as point B.

The voltage across the tunnel diode is shown in line *d* of FIG. 3 where $V_{C3}$ designates the voltage at the collector electrode 11 of transistor 12 which is equal to $V_{TD}$ the voltage across the tunnel diode.

When the tunnel diode 10 is in its low voltage state (shown as point A in FIG. 2) the voltage at the base electrode 30 of n-p-n type transistor 24 is less than the voltage, $E_3$, of source 43 applied to the base electrode 41 of n-p-n type transistor 25. As a result, when tunnel diode 10 is in its low voltage state, an input pulse from source 28 is routed through transistor 25, causing the collector voltage $V_{C2}$ of transistor 25 to go negative thereby lowering the base electrode 36 voltage of p-n-p type transistor 11 so that transistor 11 conducts the full current $I_E$ supplied by source 19 and transistor 13 is cut off. Since transistor 11 is now carrying a current $I_E$ which is greater than $I_p$, the peak value of the tunnel diode current, the tunnel diode changes to its high voltage state shown as point B in FIG. 2. The above described sequence of operation is illustrated by the waveforms shown in lines *c* and *d* of FIG. 3 in response to the first pulse shown in the lefthand portion of line *a* of FIG. 3.

When the tunnel diode is in its high voltage state, as shown as point B in FIG. 2, the voltage at the base electrode 30 of n-p-n type transistor 24 is higher than $E_3$ the voltage applied to the base electrode 41 of transistor 25 by source 43. As a result, transistor 24 conducts the input pulse so that $V_{C1}$, the voltage at collector 31, drops causing transistor 13 to conduct the full current $I_E$ from source 19 and thus turning transistor 12 off. Since a very low value of current now flows through transistor 12, the tunnel diode 10 reverts to its low voltage state.

The output is taken across tunnel diode 10 where a square wave output signal, shown in line *d* of FIG. 3 is available. An alternative output signal is also available across resistor 14 and this output signal as shown in line *e* of FIG. 3 consists of alternate positive and negative pulses in response to the input pulses shown in line *a* of FIG. 3. If a complementary square wave output is wished, this can be obtained by replacing resistor 14 with another tunnel diode 45 and this option is indicated in FIG. 1. The voltage across such a tunnel diode in response to input pulses from source 28 is shown in line *f* of FIG. 3.

A binary counter embodying this invention has very wide operating margins in that the values of the voltages supplied by sources 19, 38 and 43 may vary considerably without affecting the functioning of the circuit. In addition, relatively low tolerance resistors may be employed, and in addition, the operating characteristics of the transistors and the tunnel diode may vary relatively widely without affecting circuit operation.

It is to be understood that the above described arrangement is merely illustrative of the application of the principles of the invention. Numerous other arrangements may be devised by those skilled in the art without departing from the spirit and scope of the invention. For example the conductivity type of each transistor shown in FIG. 1 may be changed to the opposite conductivity type, the polarity of each source 19, 38 and 43 reversed, the polarity of the tunnel diode 10 reversed so that its cathode is connected to the base 30 of transistor 24 with the result that the circuit will then operate to count input pulses of opposite polarity from those shown in line *a* of FIG. 1.

What is claimed is:

1. A binary counter circuit for counting pulses from a source of input pulses comprising, in combination, a tunnel diode, a first pair of transistors of a first conductivity type and each having a base, emitter and collector, a first source of voltage, means connecting the emitters of each of said first pair of transistors to said first source of voltage, a tunnel diode connected between the collector of a first of said transistors and ground, means connecting the collector of a second of said transistors to ground, a second pair of transistors, of opposite conductivity type from said first pair of transistors, each having a base, emitter, and collector, a second source of voltage, means connecting the collectors of each of said second pair of transistors to said second source of voltage, a third voltage source, means connecting said source of input pulses to said emitters of said second pair of transistors, means connecting the base of a first of said second pair of transistors to the tunnel diode and the base of a second of said transistors to said third voltage source said third voltage source having a value of voltage greater than the voltage across said tunnel diode when said tunnel diode is in a low voltage state but less than the voltage across said tunnel diode when said tunned diode is in the high voltage state so that when said tunnel diode is in its high voltage state said first transistor of said second pair conducts an input pulse and when said tunnel diode is in its low voltage state said second transistor of said second pair conducts an input pulse, and means connecting the collector of the first transistor of said second pair to the base of the second transistor of said first pair, and means connecting the collector of the second transistor of said second pair to the base of the first transistor of said first pair so that when said first transistor of said second pair conducts an input pulse it causes said second transistor of said first pair to conduct heavily and when said second transistor of said second pair conducts said first transistor of said first pair conducts heavily causing the tunnel diode to change state in response to each input pulse.

References Cited

UNITED STATES PATENTS

| | | | |
|---|---|---|---|
| 3,144,564 | 8/1964 | Sikorra | 307—230 |
| 3,168,709 | 2/1965 | Sikorra | 330—30 |
| 3,280,347 | 10/1966 | Blokker et al. | 307—286 |
| 3,315,089 | 4/1967 | Mayne | 307—235 |
| 3,328,607 | 6/1967 | Stromer | 307—286 |

JOHN S. HEYMAN, Primary Examiner

U.S. Cl. X.R.

307—225, 238, 288